United States Patent
Ren et al.

(10) Patent No.: US 11,632,864 B2
(45) Date of Patent: Apr. 18, 2023

(54) DISPLAY DEVICE

(71) Applicant: BOE TECHNOLOGY GROUP CO., LTD., Beijing (CN)

(72) Inventors: Yan Ren, Beijing (CN); Deli Fang, Beijing (CN); Jigang Lv, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/445,491

(22) Filed: Aug. 19, 2021

(65) Prior Publication Data
US 2022/0104363 A1 Mar. 31, 2022

(30) Foreign Application Priority Data
Sep. 30, 2020 (CN) .......................... 202022208625.0

(51) Int. Cl.
H05K 5/02 (2006.01)
H05K 5/00 (2006.01)
G06F 1/16 (2006.01)

(52) U.S. Cl.
CPC ......... H05K 5/0017 (2013.01); G06F 1/1637 (2013.01); H05K 5/0217 (2013.01)

(58) Field of Classification Search
CPC ... G06F 1/1601; G06F 1/1637; H05K 5/0217; H05K 5/0017; H05K 5/03; H05K 5/04
See application file for complete search history.

(56) References Cited

U.S. PATENT DOCUMENTS

| | | | |
|---|---|---|---|
| 6,894,739 B2 * | 5/2005 | Sung | G02F 1/133308 349/59 |
| 10,492,316 B2 * | 11/2019 | Sung | G06F 1/1601 |
| 2003/0227581 A1 * | 12/2003 | Sung | G02F 1/133308 349/58 |
| 2005/0243106 A1 * | 11/2005 | Bae | H05K 7/20963 361/728 |
| 2006/0268193 A1 * | 11/2006 | Wang | G02F 1/133308 349/59 |
| 2007/0258199 A1 * | 11/2007 | Jeong | H05K 7/20963 361/679.01 |

(Continued)

FOREIGN PATENT DOCUMENTS

| | | |
|---|---|---|
| BR | 102013014535 A2 | 12/2014 |
| CN | 204539656 U | 8/2015 |

(Continued)

*Primary Examiner* — Hung S. Bui
*Assistant Examiner* — Sagar Shrestha
(74) *Attorney, Agent, or Firm* — McCoy Russell LLP (57) ABSTRACT

A display device includes: a display module including a display panel; a back cover including a main cover body and an auxiliary cover body that are detachably connected; a circuit board; and a frame module including (i) an outer frame body, and (ii) an inner frame body embedded in an inner wall of the outer frame body and connected with the outer frame body, where the display module is fixedly connected to the inner frame body; the circuit board is fixed on the auxiliary cover body and is electrically connected to the display module; the back cover faces a surface of the display panel away from a display surface, and the back cover is fixedly connected with the outer frame body and/or the inner frame body.

19 Claims, 5 Drawing Sheets

(56) References Cited

U.S. PATENT DOCUMENTS

| | | | | |
|---|---|---|---|---|
| 2008/0060244 A1* | 3/2008 | Yang | ................... | G06F 1/1601 |
| | | | | 40/716 |
| 2008/0074877 A1* | 3/2008 | Hsieh | ............... | G02F 1/133608 |
| | | | | 362/362 |
| 2008/0143918 A1* | 6/2008 | Kim | ................ | G02F 1/133608 |
| | | | | 362/362 |
| 2011/0149198 A1* | 6/2011 | Kim | ................ | G02F 1/133308 |
| | | | | 349/161 |
| 2012/0120581 A1* | 5/2012 | Haren | .................. | G06F 1/1632 |
| | | | | 361/679.21 |
| 2013/0100357 A1* | 4/2013 | Yokawa | .............. | G02B 6/0085 |
| | | | | 362/97.1 |
| 2014/0118198 A1* | 5/2014 | Kawashimo | ............ | H01Q 1/42 |
| | | | | 343/702 |
| 2016/0135282 A1* | 5/2016 | Hata | ................... | H05K 9/0032 |
| | | | | 361/720 |
| 2016/0353593 A1* | 12/2016 | Park | .................... | H05K 5/0234 |
| 2017/0318694 A1* | 11/2017 | Yun | .......................... | H04N 5/64 |
| 2018/0180929 A1* | 6/2018 | Kim | ................ | G02F 1/133308 |
| 2019/0212609 A1* | 7/2019 | Nitanai | ............ | G02F 1/133608 |

FOREIGN PATENT DOCUMENTS

| | | |
|---|---|---|
| CN | 204836365 U | 12/2015 |
| CN | 106333567 A | 1/2017 |
| CN | 208569586 U | 3/2019 |
| CN | 209447484 U | 9/2019 |
| CN | 110706617 A | 1/2020 |
| CN | 210428011 U | 4/2020 |

\* cited by examiner

DISPLAY DEVICE

CROSS-REFERENCE TO RELATED APPLICATIONS

The present application claims priority to Chinese patent application No. 202022208625.0 filed on Sep. 30, 2020. The entire contents of the above-listed application is hereby incorporated by reference for all purposes.

TECHNICAL FIELD

The present disclosure relates to the field of display technology, and to a display device.

BACKGROUND

With the development of display technology, large-size display devices are increasingly popular among people, especially for picture screen display products, which are suitable for attaching usage environments, and generally have a larger size than ordinary displays.

At present, structure of an ordinary display has problems of many components, complicated installation and time-consuming installation process. The above-mentioned problems are more obvious when the large-size display device with a usual structure is adopted.

SUMMARY

In a first aspect, the embodiments of the present disclosure provides a display device, including: a display module including a display panel; a back cover including a main cover body and an auxiliary cover body that are detachably connected; a circuit board; and a frame module including (i) an outer frame body, and (ii) an inner frame body embedded in an inner wall of the outer frame body and connected with the outer frame body. Where the display module is fixedly connected to the inner frame body; the circuit board is fixed on the auxiliary cover body and is electrically connected to the display module; the back cover faces a surface of the display module away from a display surface, and the back cover is fixedly connected with the outer frame body and/or the inner frame body.

According to a possible embodiment of the present disclosure, the main cover body is fixedly connected to the outer frame body and/or the inner frame body, and an opening is provided on the main cover body; the auxiliary cover body is connected to the main cover body through the opening, the auxiliary cover body includes a groove having an opening direction facing the display module, and the circuit board is fixed on a surface of the groove.

According to a possible embodiment of the present disclosure, the main cover body and the auxiliary cover body are made of different materials.

According to a possible embodiment of the present disclosure, the main cover body is made of plastic material, and the auxiliary cover body is made of metal material.

According to a possible embodiment of the present disclosure, the main cover body is made of electromagnetic shielding material or conductive material.

According to a possible embodiment of the present disclosure, a thermally conductive layer is provided between a chip on a surface of the circuit board facing the auxiliary cover body and the auxiliary cover body.

According to a possible embodiment of the present disclosure, the circuit board has an engagement hole, a surface of the groove has an engagement block, and the circuit board is fixed to the auxiliary cover body through the engagement hole and the engagement block.

According to a possible embodiment of the present disclosure, a distance between the circuit board and the auxiliary cover body is substantially smaller than a distance between the circuit board and the display module.

According to a possible embodiment of the present disclosure, the inner frame body includes a plurality of side frames connected end to end in sequence, the plurality of the side frames are connected to form a frame shape, and two adjacent side frames are fixedly connected by an adapter.

According to a possible embodiment of the present disclosure, each of the adapters connects two of the side frames extending in different directions.

According to a possible embodiment of the present disclosure, the plurality of the side frames include a first side frame and a second side frame that are connected with each other, one end surface of the first side frame is attached to one end surface of the second side frame, the adapter is arranged on a side away from the outer frame body, and is connected to the first side frame and the second side frame.

According to a possible embodiment of the present disclosure, the first side frame and the second side frame respectively include: a main frame body arranged to be attached along the inner wall of the outer frame body; and a side frame body connected to the main frame body and extending to a side away from the outer frame body. Where the adapter includes: a first side surface attached to the main frame body of the first side frame, a second side surface attached to the side frame body of the first side frame, a third side surface attached to the main frame body of the second side frame, and a fourth side surface attached to the side frame body of the second side frame.

According to a possible embodiment of the present disclosure, the first side frame and the second side frame are respectively provided with a slot on a side facing away from the outer frame body, and the adapter is embedded in the slots.

According to a possible embodiment of the present disclosure, an inner wall of the slot of the first side frame close to the second side frame includes a limiting surface facing the second side frame and used to limit the adapter connecting the first side frame and the second side frame.

According to a possible embodiment of the present disclosure, the plurality of the side frames further includes a third side frame and a fourth side frame, and the first side frame, the second side frame, the third side frame, and the fourth side frame are connected end to end to form a frame shape; where, on the first side frame and the third side frame facing the first side frame, inner walls of the slots arranged close to the second side frame respectively include a limiting surface facing the second side frame and used to limit the adapter; on the first side frame and the third side frame, inner walls of the slots arranged close to the fourth side frame respectively include a limiting surface facing the fourth side frame and used to limit the adapter; both ends of the second side frame and both ends of the fourth side frame are respectively connected to the first side frame and the third side frame.

According to a possible embodiment of the present disclosure, a through hole is defined on the inner frame body, and a blind hole is provided on the outer frame body at a position opposite to the through hole; the display module further includes an antenna, where the antenna penetrates the through hole, extends into the blind hole, and is fixed on the outer frame body.

According to a possible embodiment of the present disclosure, an outer surface of the antenna is provided with a first insulating layer.

According to a possible embodiment of the present disclosure, the inner frame body and the outer frame body are connected by a screw, and an insertion direction of the screw is a direction from the inner frame body to the outer frame body.

According to a possible embodiment of the present disclosure, the outer frame body is made of wood or plastic material, and the inner frame body is made of metal.

According to a possible embodiment of the present disclosure, the display device further includes a fixing plate provided between the display module and the main cover body, and the fixing plate includes a first fixing hole and a second fixing hole, the fixing plate is fixed on the display module through the first fixing hole, and the second fixing hole corresponds to a hole position of the main cover body.

BRIEF DESCRIPTION OF THE FIGURES

In order to illustrate the technical solutions of the embodiments of the present disclosure or the related art in a clearer manner, the drawings desired for describing the embodiments of the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

Hereinafter, the technical solutions in the embodiments of the present disclosure will be described clearly and thoroughly in conjunction with the drawings in the embodiments of the present disclosure. Obviously, the described embodiments are part of the embodiments of the present disclosure, but not all of the embodiments. Based on the embodiments in the present disclosure, all other embodiments obtained by a person of ordinary skill in the art without creative efforts should fall within the protection scope of the present disclosure.

In order to solve the problem of complicated installation and time-consuming installation process of display devices in related art, embodiments of the present disclosure provide a display device. In which an outer frame body and an inner frame body are combined to form a frame module, and a back cover body includes a main cover body and an auxiliary cover body that are detachably connected, a circuit board is provided on the auxiliary cover body, and the circuit board is installed on the display module to form a display integrated module combining a back shell and the display module. The frame module and the display integrated module are combined and assembled to form the display device, so that the installation and assembly of the display device is simpler and more convenient.

Figure 1:
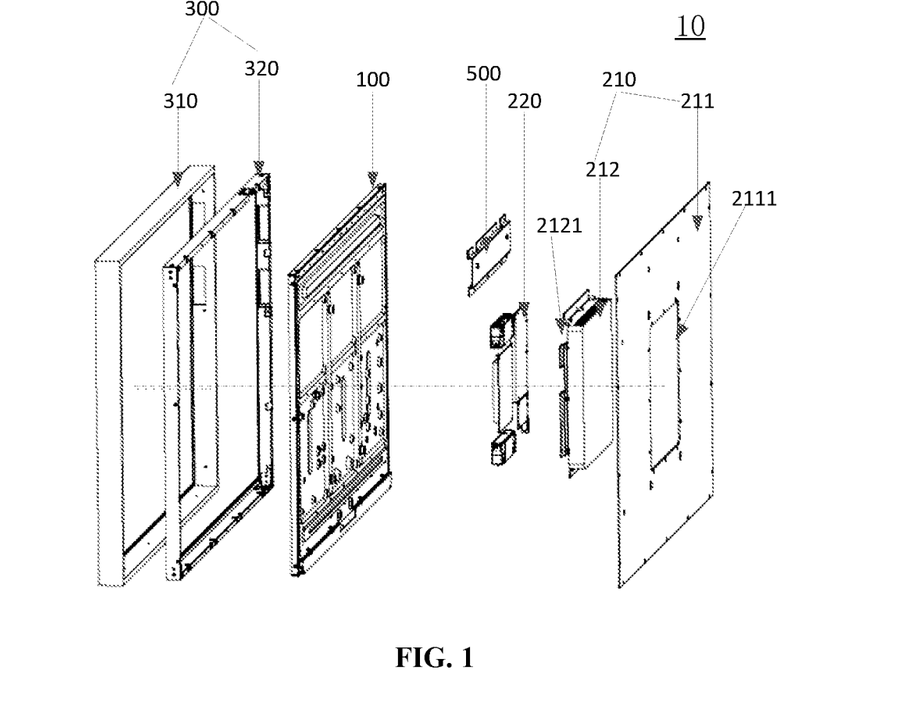
FIG. 1 is an exploded schematic view of a display device according to the present disclosure.

Specifically, as shown in FIG. 1, the display device 10 according to the embodiments of the present disclosure, includes: a display module 100 including a display panel; a back cover 210 including a main cover body 211 and an auxiliary cover body 212 that are detachably connected; a circuit board 220 fixed on the auxiliary cover body 212; and a frame module 300 including an outer frame body 310, and an inner frame body 320 embedded in an inner wall of the outer frame body 310 and connected with the outer frame body 310. And the display module 100 is fixedly connected to the inner frame body 320; the circuit board 220 is installed on the display module 100 and is electrically connected to the display module 100; the back cover 210 faces a surface of the display module 100 away from a display surface, and the back cover 210 is fixedly connected with the outer frame body 310 and/or the inner frame body 320.

In the display device 10 of this embodiment, the outer frame body 310 and the inner frame body 320 are both formed into a frame-shaped structure, and the inner frame body 320 is embedded in the inner wall of the outer frame body 310 along each inner wall surface of the outer frame body 310, and a space enclosed by the inner frame body 320 forms an installation space of the display module 100.

In the embodiments of the present disclosure, optionally, the outer frame body 310 and the inner frame body 320 are detachably connected. Assembly between the outer frame body 310 and the inner frame body 320 is facilitated through the detachable manner. For example, detachable connection between the outer frame body 310 and the inner frame body 320 includes but is not limited to only including buckle connection and screw connection.

Further, in the embodiments of the present disclosure, the outer frame body 310 and the inner frame body 320 are made of a same material, or they may be made of different materials. In one implementation, optionally, the inner frame body 320 is made of a metal material, for example, made of a material including aluminum or aluminum alloy. The outer frame body 310 is made of wood or plastic. In addition, the inner frame body 320 is made of a metal material to ensure stability when the display module 100 and the inner frame body 320 are fixedly connected. The outer frame body 310 is made of wood or plastic materials so that display requirements of the display device 10 can be met.

In the embodiments of the present disclosure, the display module 100 includes any one of an OLED display panel and a liquid crystal display panel, which is not specifically limited.

Where, by installing the circuit board 220 for display control of the display module 100 on the back cover 210, after the circuit board 220 is installed on the display module 100, the display module 100 and the back cover 210 are combined to form a display integrated module, i.e., integrated as a whole to facilitate installation with the frame module 300.

In the embodiments of the present disclosure, as shown in FIG. 1, in the back cover 210, the main cover body 211 is fixedly connected to the outer frame body 310 and/or the inner frame body 320, and an opening 2111 is provided on the main cover body 211; the auxiliary cover body 212 is fixedly connected to the main cover body 211 through the opening 2111, the auxiliary cover body 212 includes a groove 2121 having an opening direction facing the display module, and the circuit board 220 is fixed on a surface of the auxiliary cover body 212 away from the main cover body 211, i.e., fixed on a surface of the groove 2121.

With this implementation structure, the back cover covering the surface of the display module 100 away from the display surface is composed of two parts, where the auxiliary cover body 212 is used to install the circuit board 220, and the main cover body 211 is used to fixedly connect with the outer frame body 310 and/or the inner frame body 320. Optionally, the main cover body 211 and the auxiliary cover body 212 are made of different materials. For example, the main cover body 211 is made of plastic material, and the auxiliary cover body 212 is made of metal material. The auxiliary cover body 212 for mounting the circuit board 220 is made of metal material so as to ensure stability of the circuit board 220 installation.

Optionally, the main cover body 211 is made of electromagnetic shielding material or conductive material. On the one hand, electromagnetic shielding material is used to prevent external signals from interfering with signals of internal circuit board. On the other hand, a conductive material can facilitate good heat dissipation of the circuit board.

In addition, the main cover body 211 is made of plastic materials, which can be directly cut to form the opening 2111 during production without mold processing so as to save mold costs. In addition, the main cover body 211 uses plastic materials that are lighter than metal materials, which reduces an overall weight of the back shell.

In this implementation, optionally, in order to ensure aesthetics of an outer surface of the back cover 210, a surface of the auxiliary cover body 212 exposed through the opening 2111 and a surface of the main cover body 211 facing away from the display module 100 are located in substantially a same plane. In this way, a surface of the back cover 210 (that is, the back shell of the display device) away from the display surface of the display module is substantially flat.

Optionally, the main cover body 211 and the auxiliary cover body 212 may be connected by a screw. However, those skilled in the art can understand that the main cover body 211 and the auxiliary cover body 212 can also be fixedly connected by other common connection methods, such as various forms of nails and pins, wedges, mortises, dovetails, and the details will not be repeated herein.

Optionally, a flanging is provided on the auxiliary cover body 212 to ensure airtightness of connection between the auxiliary cover body 212 and the main cover body 211 and prevent dust from entering.

Further, optionally, a heat dissipation hole may be provided on the main cover body 211 for heat dissipation of the display module 100. Optionally, a layer of thermally conductive material, such as thermally conductive silica gel, is attached between a heating element of the display module 100 and the main cover body 211, and/or between the circuit board 220 and the auxiliary cover body 212 to further realize heat dissipation of the display module 100.

In addition, a thermally conductive layer is provided between a chip on a surface of the circuit board facing the auxiliary cover body 212 and the auxiliary cover body 212. For example, the thermally conductive layer is silica gel to facilitate further internal heat dissipation of the display device.

According to one implementation, optionally, the circuit board 220 has an engagement hole, the surface of the groove 2121 has an engagement block, and the circuit board 220 is fixed to the auxiliary cover body 212 through cooperation between the engagement hole and the engagement block. Where the circuit board 220 can be fixed to the auxiliary cover body 212 through engagement between the engagement hole and the engagement block. It should be noted that the connection between the circuit board 220 and the auxiliary cover body 212 is not limited to be only fixing by engagement, for example, it may also be realized by a screw connection, and each implementation will not be illustrated separately here.

According to the embodiments of the present disclosure, optionally, a distance between the circuit board 220 and the auxiliary cover body 212 is substantially smaller than a distance between the circuit board 220 and the display module 100.

By making the distance between the circuit board 220 and the auxiliary cover body 212 made of metal material closer, heat dissipation through the auxiliary cover body 212 is facilitated.

Figure 2:
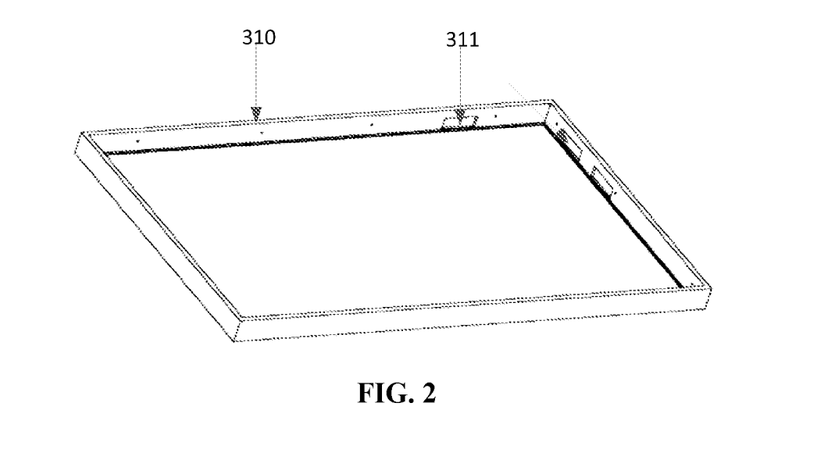
FIG. 2 is a perspective view of an outer frame body according to an embodiment of the present disclosure.

According to the embodiments of the present disclosure, in one implementation of the display device as shown in FIG. 2, the outer frame body 310 is formed as an integrated structure of a frame shape.

Figure 3:
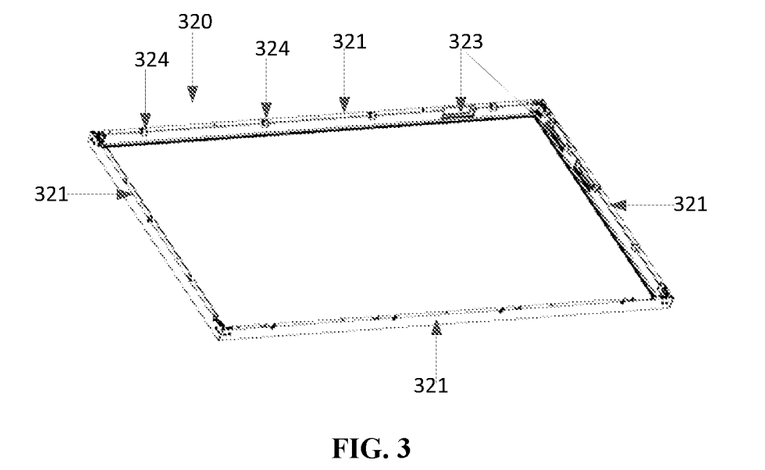
FIG. 3 is a first perspective view of an inner frame body according to an embodiment of the present disclosure.
Figure 4:
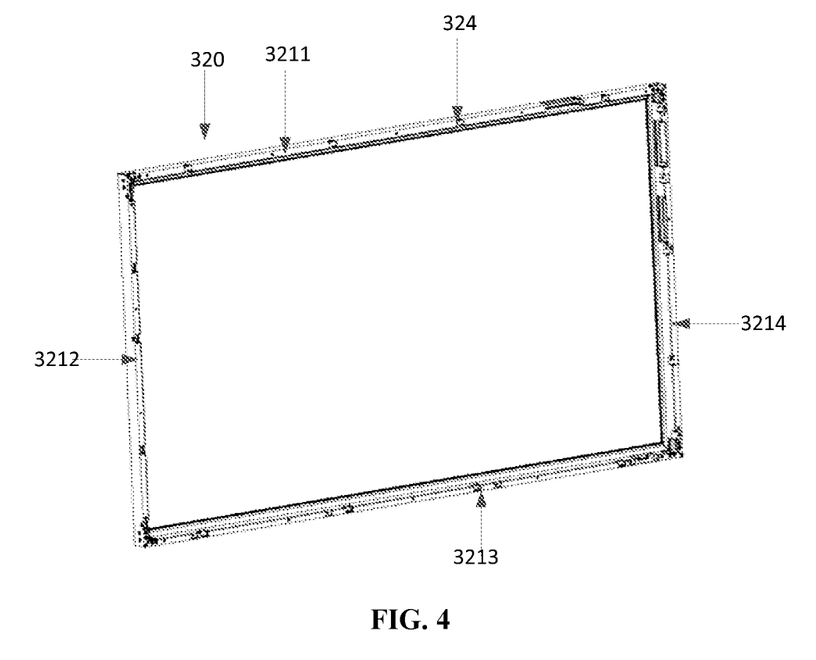
FIG. 4 is a second perspective view of an inner frame body according to an embodiment of the present disclosure.

Optionally, as shown in FIG. 3 and FIG. 4, the inner frame body 320 includes a plurality of side frames 321 connected end to end in sequence, the plurality of side frames 321 are connected to form a frame shape, and two adjacent side frames are fixedly connected by an adapter.

In this implementation, optionally, in order to adapt to a quadrilateral structure of the display module 100, the outer frame body 310 and the inner frame body 320 are both formed into a quadrilateral frame.

Figure 5:
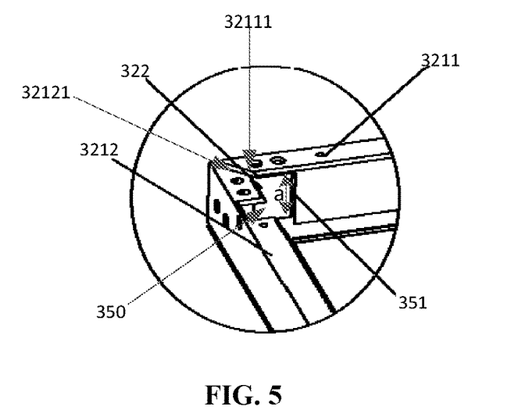
FIG. 5 is first partially enlarged schematic view of an inner frame body according to an embodiment of the present disclosure.
Figure 6:
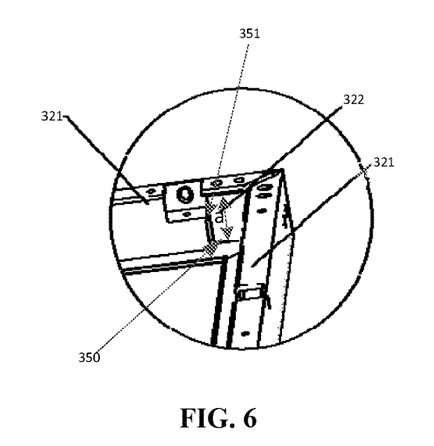
FIG. 6 is a second partially enlarged schematic view of an inner frame body according to an embodiment of the present disclosure.

Specifically, as shown in FIGS. 5 and 6, an adapter 322 for connecting the side frames 321 to form the inner frame body 320 connects two side frames 321 extending in different directions. That is, specifically, each adapter 322 is provided at a corner position of the inner frame body 320 for connecting two side frames 321 extending in different directions (i.e., extending substantially perpendicular to each other) at the corner position.

Among them, as shown in FIG. 5, in connected first side frame 3211 and second side frame 3212 of the plurality of side frames 321, a first end surface 32111 of the first side frame 3211 is attached to a second end surface 32121 of the second side frame 3212, and the adapter 322 is provided on a side of the side frame 321 away from the outer frame body 310 and is connected to the first side frame 3211 and the second side frame 3212.

With this implementation structure, the plurality of side frames 321 connected by the adapters 322 are formed as an end-to-end fashion, and any one end surface of any one side frame 321 is attached and fixed to one end surface of an adjacent side frame 321 to ensure shape stability of the inner frame body 320 of a quadrilateral formed by the plurality of side frames 321.

Figure 7:
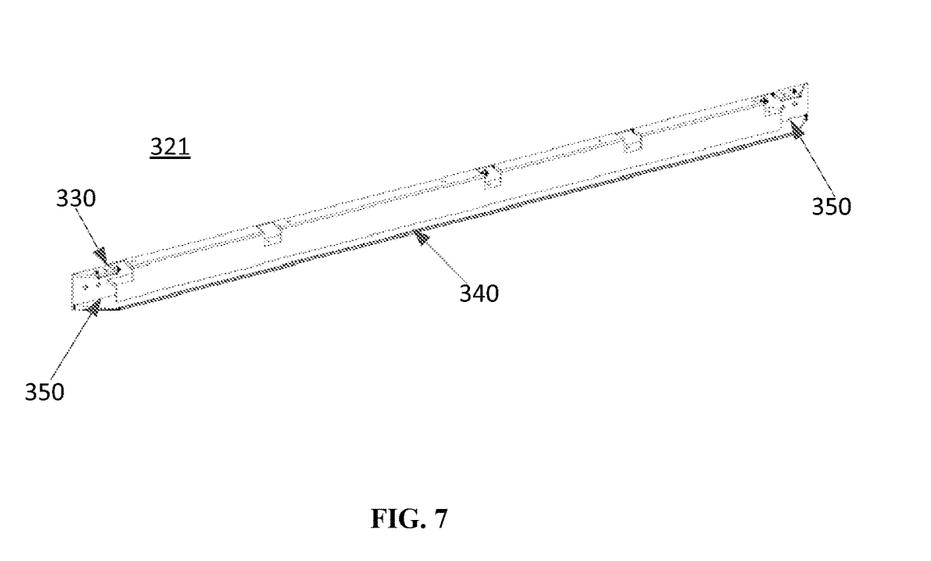
FIG. 7 is a schematic view of one frame of an inner frame body according to an embodiment of the present disclosure.
Figure 8:
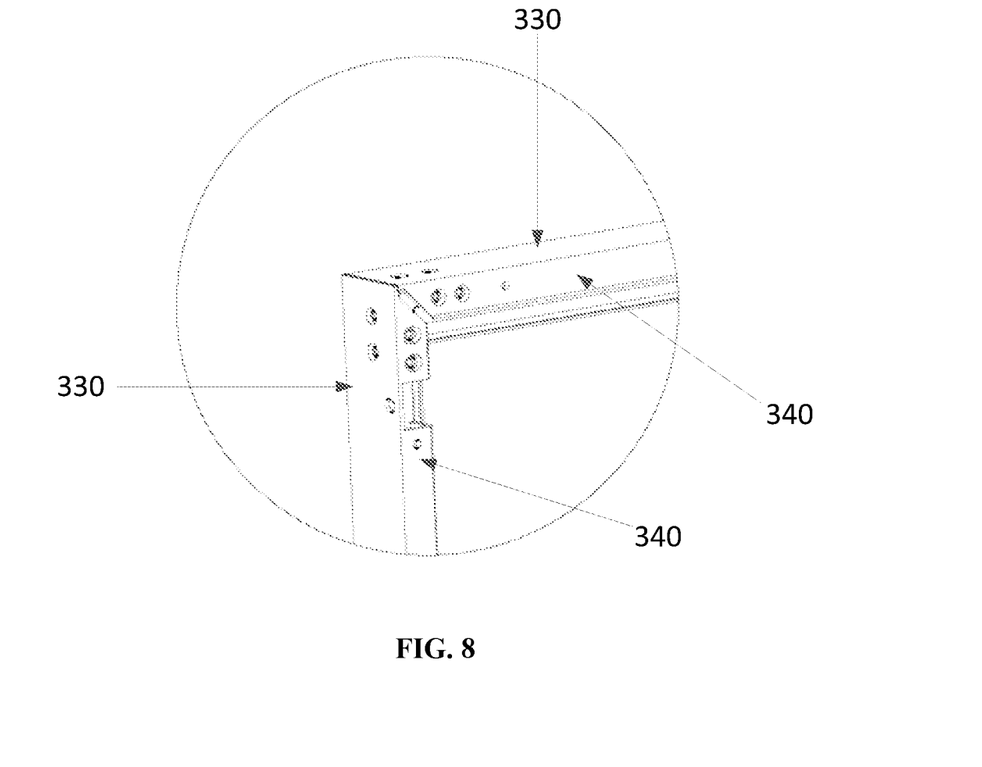
FIG. 8 is third partially enlarged schematic view of an inner frame body according to an embodiment of the present disclosure.

In the embodiments of the present disclosure, as shown in FIGS. 7 and 8 in combination with FIGS. 1 and 2, the first side frame 3211 and the second side frame 3212 (that is, each side frame 321) respectively include: a main frame body 330 arranged to be attached along the inner wall of the outer frame body 310; and a side frame body 340 connected to the main frame body 330 and extending to a side away from the outer frame body 310.

Figure 9:
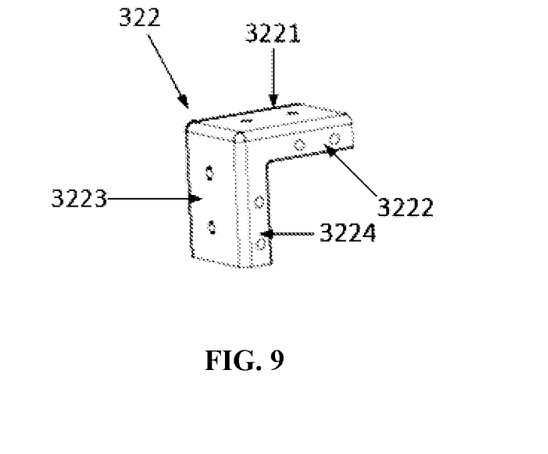
FIG. 9 is a schematic view of an adapter according to an embodiment of the present disclosure.

Specifically as shown in FIG. 9 in combination with FIGS. 5 and 6, the adapter connecting the first side frame 3211 and the second side frame 3212 includes: a first side surface 3221 attached to the main frame body 330 of the first side frame 3211, a second side surface 3222 attached to the side frame body 340 of the first side frame 3211, a third side surface 3223 attached to the main frame body 330 of the second side frame 3212, and a fourth side surface 3224 attached to the side frame body 340 of the second side frame 3212.

With this implementation structure, the adaptor 322 is formed in an "L" shape, and connected to each side frame 321 through two side surfaces respectively to ensure stability of connection with the side frames 321.

Optionally, the adaptors 322 are connected to the side frames 321 through screws respectively. However, those skilled in the art can understand that the adaptor 322 and each side frame 321 can also be fixedly connected by other common connection methods, such as various forms of nails and pins, wedges, mortises, dovetails, and the details will not be repeated herein.

According to the embodiments of the present disclosure, optionally, as shown in FIGS. 5 to 7, optionally, both ends of each side frame 321 are respectively provided with a slot 350 on a side facing away from the outer frame body 310, and the adapters 322 are embedded in the slots 350.

Specifically, by providing the slot 350, a space for accommodating the adapter 322 is formed on the side of the side frame 321 facing away from the outer frame body 310. Optionally, a width of the slot 350 provided on the side frame 321 matches a width of the adapter 322. As shown in FIGS. 5 and 6, a direction a of the width is perpendicular to a direction from one end to the other end of the side frame 321 when the adapter 322 is provided in the slot 350. In this implementation structure, by matching the width of the slot 350 with the width of the adaptor 322, the adaptor 322 cannot move in a direction perpendicular to a length extension direction of the side frame 321 when the adapter 322 is provided in the slot 350. The adapter 322 is limited in the slot 350 to facilitate subsequent installation and fixation with the side frame 321, which may ensure that the adapter 322 is stably installed on the side frame 321.

According to the embodiments of the present disclosure, optionally, as shown in FIGS. 4 to 7, an inner wall of the slot of the first side frame 3211 close to the second side frame 3212 includes a limiting surface 351 facing the second side frame 3212 and used to limit the adapter 322 connecting the first side frame 3211 and the second side frame 3212.

The plurality of side frames further includes a third side frame 3213 and a fourth side frame 3214. Correspondingly, the first side frame 3211, the second side frame 3212, the third side frame 3213, and the fourth side frame 3214 are connected end to end to form a frame shape. Specifically, among the plurality of side frames 321, on the first side frame 3211 and the third side frame 3213 facing the first side frame, inner walls of the slots 350 arranged close to the second side frame 3212 respectively include a limiting surface 351 facing the second side frame 3212 and used to limit the adapter 322. On the first side frame 3211 and the third side frame 3213, inner walls of the slots 350 arranged close to the fourth side frame 3214 respectively include a limiting surface 351 facing the fourth side frame 3214 and used to limit the adapter 322. Where both ends of the second side frame 3212 and both ends of the fourth side frame 3214 are respectively connected to the first side frame 3211 and the third side frame 3213.

With this implementation structure, for two adjacent side frames 321, such as the first side frame 3211 and the second side frame 3212, or the first side frame 3211 and the fourth side frame 3214, or the third side frame 3213 and the second side frame 3212, or the third side frame 3213 and the fourth side frame 3214, when any two adjacent side frames 321 are installed, a part of the "L" shape of the adapter 322 may be inserted into the slot 350 of one of the two side frames 321 firstly until moving to the limit surface 351, and then the adapter 322 and the side frame 321 are locked by a screw. Based on this, the other part of the "L" shape of the adapter 322 is inserted into the slot 350 of the other side frame 321, and the two side frames 321 connected are spliced to form a diagonal connection, and then, for example, the adapter 322 and the other side frame 321 are locked by a screw. In this way, assembly of one end position of the two side frames 321 is completed, and assembly of each side frame 321 can be completed in sequence in a same process to form a quadrilateral inner frame body 320.

In this embodiment, optionally, on the second side frame 3212 and the fourth side frame 3214, the inner wall of the slot 350 may not be provided with limiting surfaces facing the first side frame 3211 and the third side frame 3213, respectively. Where, providing the limiting surfaces 351 on the first side frame 3211 and the third side frame 3213 realize a limiting function of the adapter 322 during the assembling process of the side frames 321, and not providing limiting surfaces on the second side frame 3212 and the fourth side frame 3214 may reduce too many restrictions, and facilitate adjustment of seams when the adjacent side frames 321 are assembled.

In the embodiments of the present disclosure, optionally, the first side frame 3211 and the third side frame 3213 are side frames located at upper and lower ends of the display device substantially perpendicular to a placement surface of the display device.

It should be noted that the above-mentioned structure in which the inner frame body 320 is assembled and connected through the adapters 322 is only an example for illustration, and the details are not limited thereto. For example, the adapters 322 can be connected to each side frame 321 through two side surfaces, and can also be provided with three side surfaces connected to each side frame 321 to further ensure the stability of the connection with the side frames 321.

The inner frame body 320 assembled through the above-mentioned implementation structure is formed as a tetrahedron with four outer side surfaces sequentially connected, and has a size matching a size of four inner wall surfaces of the outer frame body 310. In this way, when the inner frame body 320 is disposed inside the outer frame body 310, an outer surface of the inner frame body 320 is attached to the inner wall surface of the outer frame body 310, and the inner frame body 320 is installed on the outer frame body 310. Optionally, after the inner frame body 320 is installed on the outer frame body 310, the inner frame body 320 and the outer frame body 310 may be further connected, for example, by screws, to ensure the installation stability between the inner frame body 320 and the outer frame body 310 and avoid separation and fall off. Since the outer surface of the outer frame body 310 is formed as an outer surface of the display device, in order to ensure aesthetics of the display device, an insertion direction of the screws connecting the inner frame body 320 and the outer frame body 310 is from the inner frame body 320 to the outer frame body 310 so that the inserted screws may be completely or partially covered.

Optionally, when the side frames 321 of the inner frame body 320 and the outer frame body 310 are locked by the screw, the screws are provided at a position between the display module 100 and the outer frame body 310 and/or at a position between the back cover 210 and the outer frame body 310 to be completely or partially covered by the display module 100 and the back cover 210, so as to ensure that in an assembly of a whole machine, the screw connecting the outer frame body 310 and the inner frame body 320 cannot be seen from a rear side of the display module 100 and ensure that disassembly and assembly of the display module 100 and replacement of the outer frame body 310 are relatively easy.

According to the embodiments of the present disclosure, as shown in FIG. 2 and FIG. 3, optionally, a through hole 323 is defined on the inner frame body 320, and a blind hole 311 is provided on the outer frame body 310 at a position opposite to the through hole 323.

The display module further includes an antenna (not shown), where the antenna penetrates the through hole 323, extends into the blind hole 311, and is fixed on the outer frame body 310.

Optionally, an outer surface of the antenna is provided with a first insulating layer. The first insulating layer is provided to avoid a problem of that contact between the antenna and the inner frame body 320 made of the metal material affects operation of the antenna when the antenna shakes or falls in an event of external vibration or failure of an adhesive layer between the antenna and the outer frame body 310. When the inner frame body 320 is made of metal material, and the outer frame body 310 is made of wood or plastic, the implementation structure is adopted to extend the antenna on the display module through the inner frame body 320 to the outer frame body 310, so that the antenna may be as close as possible to the outer frame body 310, and a metal shielding layer should be avoided around the antenna to avoid a shielding effect of the inner frame body 320 made of metal material on the antenna, so as to ensure sufficient signal strength of an antenna signal.

Optionally, at least two through holes 323 are provided on the inner frame body 320 and are located on two adjacent side frames 321 of the inner frame body 320. Optionally, through holes 323 may be respectively provided on the side frames 321 corresponding to an upper frame and a right frame of the display device. Correspondingly, blind holes 311 are respectively provided at corresponding positions on the outer frame body 310.

As shown in FIG. 1, the display device according to the embodiments of the present disclosure further includes a fixing plate 500. The fixing plate 500 includes a first fixing hole and a second fixing hole, where the fixing plate 500 is fixed on the display module 100 through the first fixing hole, and the second fixing hole corresponds to a hole position of the main cover body 211.

Specifically, the main cover body 211 is provided with a hole corresponding to the second fixing hole, and holes provided on the main cover body 211 and the fixing plate 500 can be used to connect the display device to other pendants for wall hanging.

Figure 10:
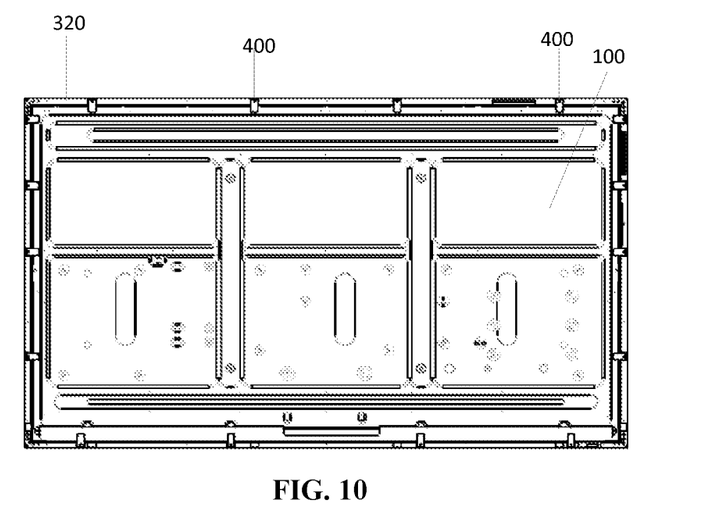
FIG. 10 is a back view of a display device according to the present disclosure.

For the display device according to the embodiments of the present disclosure, referring to FIG. 1 to FIG. 11, an assembly process may include the following steps:

1) the inner frame body 320 and the outer frame body 310 are combined to form the frame module;

2) the circuit board 220 is installed on the auxiliary cover 212, and the auxiliary cover 212 is fixedly connected to the main cover body 211, and then the circuit board 220 is installed on the display module 100, and the display module 100 is combined with the back cover 210 to form as a display integrated device;

3) the display integrated device is provided to be opposite to the frame module, the display module 100 is located in the space enclosed by the inner frame body 320, and an edge of the main cover body 211 is attached to the inner frame body 320; in the embodiments of the present disclosure, optionally, as shown in FIG. 7 and FIG. 8, the edge of the main cover body 211 is attached to the side frame body 340 of the side frame 321 of the inner frame body 320. As shown in FIG. 3 and FIG. 4, the side frame body 340 of each side frame 321 is provided with a plurality of grooves 324 spaced apart. Specifically, when the display module 100 is installed in the frame module, a pressing sheet 400 is attached to the groove 324. As shown in FIG. 10, the pressing sheet 400 abuts against the display module 100 and the side frame body 340 to fix the display module 100 on the side frame body 340 to realize a fixed connection between the display module 100 and the side frames, as shown in FIG. 11.

Figure 11:
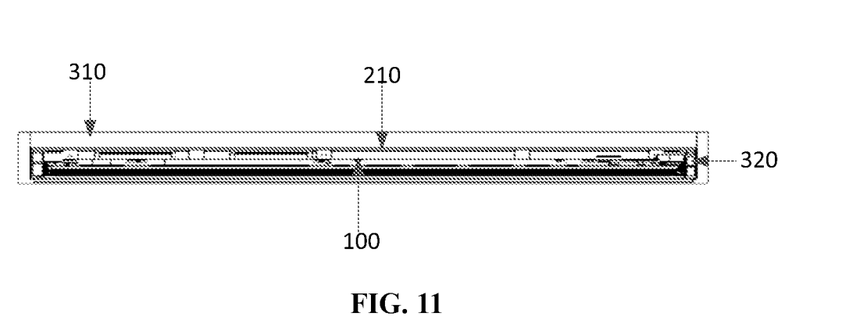
FIG. 11 is a side view of a display device according to an embodiment of the present disclosure.

According to the embodiments of the present disclosure, as shown in FIG. 11, when the inner frame body 320 is embedded in the outer frame body 310, in a direction substantially perpendicular to an extending length direction of the side frame 321 of the inner frame 320, a width of the inner frame body 320 is substantially smaller than a width of the outer frame body 310, so that the entire inner frame body 320 is embedded in a space enclosed by the outer frame body 310. Optionally, the display integrated device formed by the combination of the display module 100 and the back cover 210 is also entirely embedded in the space enclosed by the outer frame body 310, so that only an outer side surface of the outer frame body 310 can be viewed from a side of the entire display device.

It should be noted that the assembly process of the display device is not limited to a sequence defined by the above steps. For example, the following process may also be used:

1) the inner frame body 320 and the outer frame body 310 are combined to form the frame module;

2) the display module 100 is provided in a space enclosed by the inner frame body 320, and is fixedly connected to the inner frame body 320 through the pressing sheet 400;

3) after the circuit board 220 is installed on the auxiliary cover body 212, the circuit board 220 is installed on the display module 100;

4) the main cover body 211 is covered on a side of the display module 100 away from the display surface. And the edge of the main cover body 211 is attached to the inner frame body 320 and is fixedly connected to the inner frame body 320 and the auxiliary cover body 212.

In the display device according to the embodiments of the present disclosure, an outer frame body and an inner frame body are combined to form a frame module, and a circuit board is provided on the back cover, and the display module and the back cover form a display integrated module. The frame module and the display integrated module are combined and assembled to form the display device. So that the installation and assembly of the display device is simpler and more convenient.

The foregoing descriptions are merely preferable implementations of the present disclosure. It should be noted that a person of ordinary skill in the art may make several improvements or polishing without departing from the principle of this disclosure and the improvements and polishing shall fall within the protection scope of the present disclosure.

The invention claimed is:

1. A display device, comprising:
a display module comprising a display panel;
a back cover comprising a main cover body and an auxiliary cover body that are detachably connected;
a circuit board; and
a frame module comprising (i) an outer frame body, and (ii) an inner frame body embedded in an inner wall of the outer frame body and connected with the outer frame body,
wherein the display module is fixedly connected to the inner frame body; the circuit board is fixed on the auxiliary cover body and is electrically connected to the display module; the back cover faces a surface of the display module away from a display surface, and the back cover is fixedly connected with the inner frame body,
an opening is provided on the main cover body, the auxiliary cover body is connected to the main cover body through the opening, and a surface of the auxiliary cover body exposed through the opening and a surface of the main cover body facing away from the display module are located in a same plane, and
the auxiliary cover body comprises a groove having an opening direction facing the display module, and the circuit board is fixed on a surface of the groove.

2. The display device according to claim 1, wherein the main cover body and the auxiliary cover body are made of different materials.

3. The display device according to claim 2, wherein the main cover body is made of plastic material, and the auxiliary cover body is made of metal material.

4. The display device according to claim 2, wherein the main cover body is made of electromagnetic shielding material or conductive material.

5. The display device according to claim 1, wherein a thermally conductive layer is provided between a chip on a surface of the circuit board facing the auxiliary cover body and the auxiliary cover body.

6. The display device according to claim 1, wherein the circuit board has an engagement hole, a surface of the groove has an engagement block, and the circuit board is fixed to the auxiliary cover body through the engagement hole and the engagement block.

7. The display device according to claim 1, wherein a distance between the circuit board and the auxiliary cover body is smaller than a distance between the circuit board and the display module.

8. The display device according to claim 1, wherein the inner frame body comprises a plurality of side frames connected end to end in sequence, the plurality of the side frames are connected to form a frame shape, and two adjacent side frames are fixedly connected by an adapter.

9. The display device according to claim 8, wherein each of the adapters connects two of the side frames extending in different directions.

10. The display device according to claim 9, wherein the plurality of the side frames comprise a first side frame and a second side frame that are connected with each other, one end surface of the first side frame is attached to one end surface of the second side frame, the adapter is arranged on a side away from the outer frame body, and is connected to the first side frame and the second side frame.

11. The display device according to claim 10, wherein the first side frame and the second side frame respectively comprises:
a main frame body arranged to be attached along the inner wall of the outer frame body; and
a side frame body connected to the main frame body and extending to a side away from the outer frame body,
wherein the adapter comprises: a first side surface attached to the main frame body of the first side frame, a second side surface attached to the side frame body of the first side frame, a third side surface attached to the main frame body of the second side frame, and a fourth side surface attached to the side frame body of the second side frame.

12. The display device according to claim 10, wherein the first side frame and the second side frame are respectively provided with a slot on a side facing away from the outer frame body, and the adapter is embedded in the slots.

13. The display device according to claim 12, wherein an inner wall of the slot of the first side frame close to the second side frame comprises a limiting surface facing the second side frame and used to limit the adapter connecting the first side frame and the second side frame.

14. The display device according to claim 13, wherein the plurality of the side frames further comprises a third side frame and a fourth side frame, and the first side frame, the second side frame, the third side frame, and the fourth side frame are connected end to end to form a frame shape;
wherein on the first side frame and the third side frame facing the first side frame, inner walls of the slots arranged close to the second side frame respectively comprise a limiting surface facing the second side frame and used to limit the adapter;
on the first side frame and the third side, inner walls of the slots arranged close to the fourth side frame respectively comprise a limiting surface facing the fourth side frame and used to limit the adapter;
both ends of the second side frame and both ends of the fourth side frame are respectively connected to the first side frame and the third side frame.

15. The display device according to claim 1, wherein a through hole is defined on the inner frame body, and a blind hole is provided on the outer frame body at a position opposite to the through hole;
the display module further comprises an antenna, wherein the antenna penetrates the through hole, extends into the blind hole, and is fixed on the outer frame body.

16. The display device according to claim 15, wherein an outer surface of the antenna is provided with a first insulating layer.

17. The display device according to claim 1, wherein the inner frame body and the outer frame body are connected by a screw, and an insertion direction of the screw is a direction from the inner frame body to the outer frame body.

18. The display device according to claim 1, wherein the outer frame body is made of wood or plastic material, and the inner frame body is made of metal.

19. The display device according to claim 1, wherein the display device further comprises a fixing plate provided between the display module and the main cover body, and the fixing plate comprises a first fixing hole and a second fixing hole, the fixing plate is fixed on the display module through the first fixing hole, and the second fixing hole corresponds to a hole position of the main cover body.

\* \* \* \* \*